United States Patent
Ramaraju et al.

(10) Patent No.: US 7,489,540 B2
(45) Date of Patent: Feb. 10, 2009

(54) BITCELL WITH VARIABLE-CONDUCTANCE TRANSFER GATE AND METHOD THEREOF

(75) Inventors: Ravindraraj Ramaraju, Round Rock, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 11/752,051

(22) Filed: May 22, 2007

(65) Prior Publication Data
US 2008/0291768 A1 Nov. 27, 2008

(51) Int. Cl.
*G11C 11/00* (2006.01)
(52) U.S. Cl. ............ 365/156; 365/154; 365/227
(58) Field of Classification Search .......... 365/156, 365/154, 227
See application file for complete search history.

(56) References Cited

U.S. PATENT DOCUMENTS

| | | | |
|---|---|---|---|
| 5,353,251 A * | 10/1994 | Uratani et al. ............ | 365/156 |
| 5,455,789 A | 10/1995 | Nakamura et al. | |
| 5,706,226 A | 1/1998 | Chan et al. | |
| 5,828,597 A | 10/1998 | Madan | |
| 5,991,208 A | 11/1999 | Aipperspach et al. | |
| 5,991,224 A | 11/1999 | Aipperspach et al. | |
| 6,804,143 B1 | 10/2004 | Hobson | |
| 7,061,793 B2 | 6/2006 | Barth, Jr. et al. | |
| 7,154,770 B2 | 12/2006 | Islam | |
| 7,193,924 B2 | 3/2007 | Ramaraju et al. | |
| 7,408,800 B1 * | 8/2008 | Braceras et al. ............ | 365/154 |
| 2004/0037148 A1 | 2/2004 | Hidaka | |

FOREIGN PATENT DOCUMENTS

| JP | 10-027476 A | 1/1998 |
|---|---|---|
| JP | 2001-143473 A | 5/2001 |

OTHER PUBLICATIONS

U.S. Appl. No. 11/337,775, filed Jan. 23, 2006, entitled "Electronic Device and Method for Operating a Memory Circuit".
U.S. Appl. No. 11/435,942, filed May 17, 2006, entitled "Low Voltage Memory Device and Method Thereof".
U.S. Appl. No. 11/560,607, filed Nov. 16, 2006 entitled "Photon-Based Memory Device and Method Thereof".
U.S. Appl. No. 11/561,449, filed Nov. 20, 2006 entitled "Memory Device Having Concurrent Write and Read Cycles and Method Thereof".

(Continued)

*Primary Examiner*—Huan Hoang

(57) ABSTRACT

A memory device comprises a bit cell comprising a bit storage device, a first word line, a second word line, and a first transfer gate to connect the bit storage device to a bit line. The first transfer gate is configurable to at least four conductance states based on a state of the first word line and a state of the second word line. The memory device further comprises control logic to configure, for an access to the bit cell, the state of the first word line and the state of the second word line based on an access type of the access.

20 Claims, 3 Drawing Sheets

OTHER PUBLICATIONS

U.S. Appl. No. 11/620,080, filed Jan. 5, 2007, entitled "Dynamic Module Output Device and Method Thereof".

U.S. Appl. No. 11/553,022, filed Oct. 26, 2006, entitled "Storage Device and Methods Thereof".

U.S. Appl. No. 11/362,694, filed Feb. 27, 2006, entitled "Bit Line Precharge in Embedded Memory".

U.S. Appl. No. 11/438,890, filed May 23, 2006, entitled "Contention-free Hierarchical Bit Line in Embedded Memory and Method Thereof".

U.S. Appl. No. 11/388,921, filed Mar. 24, 2006, entitled "Circuit and Method for Latch Bypass".

U.S. Appl. No. 11/400,417, filed Apr. 7, 2006, entitled "Programmable Cell".

* cited by examiner

500 ⤵

| | PWL | NWL | TRANSFER GATE CONDUCTANCE |
|---|---|---|---|
| WRITE | L | H | HIGH |
| READ (NV) | H | H | LOW |
| READ (LV) | L | L | VERY LOW |
| NO ACCESS | H | L | 0 |

BITCELL WITH VARIABLE-CONDUCTANCE TRANSFER GATE AND METHOD THEREOF

FIELD OF THE DISCLOSURE

The present disclosure relates to memory devices, and relates more particularly to read and write accesses to bit cells of memory devices.

BACKGROUND

Conventional memory bit cells typically face a trade-off between stability and performance when implementing transfer gates to connect storage devices to bit lines. A higher Beta ($\beta$) ratio between the transfer gate and the storage device typically results in higher stability, whereas a lower Beta ratio typically results in improved writeability. Likewise, a higher Alpha ($\alpha$) ratio between the transfer gate and the storage device typically results in higher stability, whereas a lower Alpha ratio typically results in improved writeability. This issue is further compounded in memory systems utilizing multiple power states.

DETAILED DESCRIPTION

Figure 1:
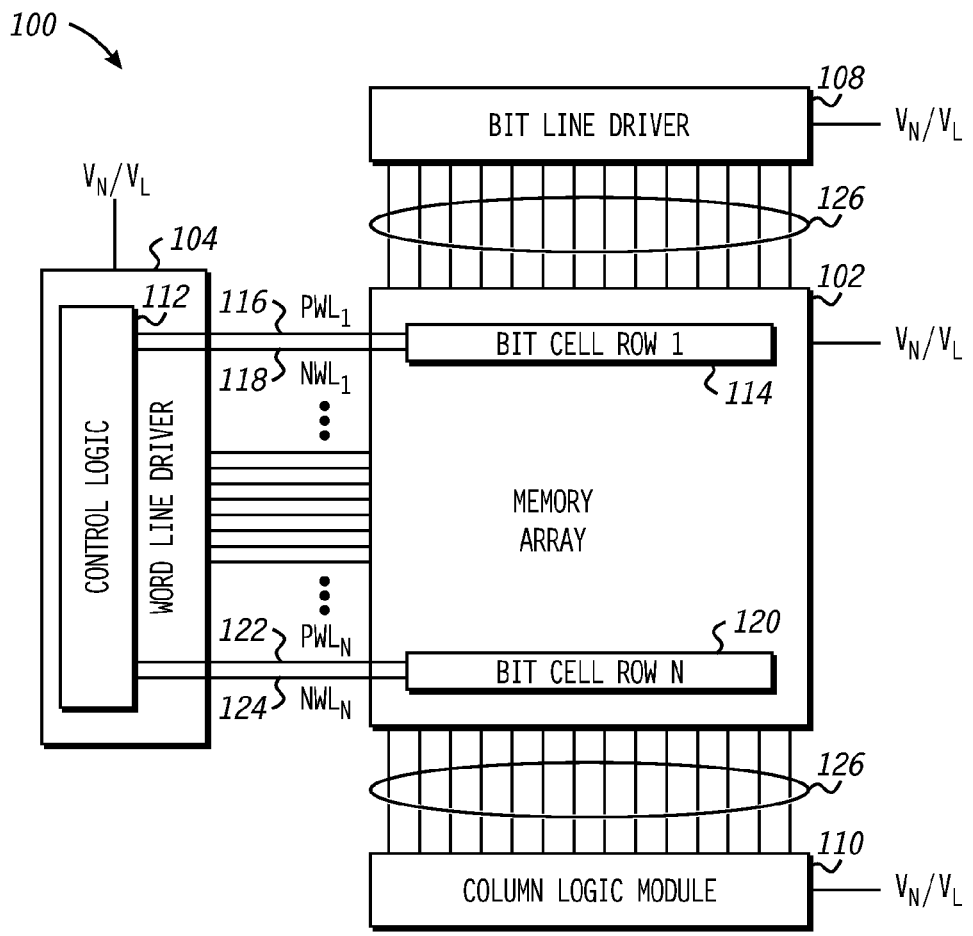
FIG. 1 illustrates a block diagram of a particular embodiment of a memory device.

In accordance with one aspect of the present disclosure, a memory device comprises a bit cell comprising a bit storage device, a first word line, a second word line, and a first transfer gate to connect the bit storage device to a bit line, the first transfer gate configurable to at least four conductance states based on a state of the first word line and a state of the second word line, and control logic to configure, for an access to the bit cell, the state of the first word line and the state of the second word line based on an access type of the access.

In accordance with another aspect of the present disclosure, a method comprises providing a memory device comprising a bit cell comprising a bit storage device coupled to a bit line via a transfer gate and initiating an access to the bit cell. The method further comprises configuring the transfer gate to have a first conductance in response to the access comprising a read access at a first voltage level and configuring the transfer gate to have a second conductance in response to the access comprising a read access at a second voltage level, the second conductance different than the first conductance and the second voltage level different than the first voltage level. The method further includes accessing the bit storage device via the transfer gate.

FIGS. 1-6 illustrate techniques for adjusting the conductance of a transfer gate of the bit cell during an access to the bit cell based on the type of access so as to improve bit cell stability. In one embodiment, the transfer gate is controlled by at least two word lines and the bit cell has control logic that independently controls the states of the word lines to configure the conductance state of the transfer gate. For a write access to the bit cell, the control logic configures the transfer gate to have one conductance. For a normal read access to the bit cell, the control logic configures the transfer gate to have another conductance, different than the conductance for the write access. Further, in at least one embodiment, the bit cell is read accessible in a low-power state, and for a low-power read access to the bit cell, the control logic configures the transfer gate to have an additional conductance, different than the first two conductances. Further, when the bit cell is not being accessed, the control logic configures the transfer gate to have even another conductance state, which typically is a substantially non-conductive state. Thus, by configuring the transfer gate to have different conductance states based on the type of access to the bit cell, the bit stability can be improved.

One conductance allows increased bitcell writeability during the write access to the bit cell, because the high conductance of the transfer gate improves the ability of the transfer gate to pass the logic voltage from a bit line to the bit storage device. Additionally, another conductance improves bit stability during the normal read access of the bit cell. The low conductance of the transfer gate during the normal read access allows the logic from the bit cell to pass to the bit line, but does not allow logic already on the bit line to pass to the bit cell. This level of conductance improves stability because the possibility of corruption of the bit cell data is reduced. An additional conductance improves bit stability during the low-power read access, because the very low conductance of the transfer gate allows the logic from the bit cell to pass to the bit line without corruption of the bit cell.

FIG. 1 illustrates a block diagram of a particular embodiment of a memory device 100. The memory device 100 includes a memory array 102, a word line driver 104, a bit line driver 108, and a column logic module 110. The memory device 100 can comprise any of a variety of memory architectures, such as, for example, a static random access memory (SRAM) architecture, or a dynamic random access memory (DRAM) architecture.

The memory array 102 comprises an array of bit cells organized by row and column. In the illustrated embodiment, access to a particular bit cell row is initiated based on the manipulation of a corresponding pair of word lines, identified herein as PWL and NWL, whereby each word line of the pair can be independently configured by control logic 112 of the word line driver 104. To illustrate, a first bit cell row 114 is accessed based on a pair of word lines comprising $PWL_1$ 116 and $NWL_1$ 118 and an Nth bit cell row 120 is accessed based on a pair of word lines comprising $PWL_N$ 122 and $NWL_N$ 124. The bit cells of an accessed bit cell row are modified during write accesses based on the configuration of the bit lines 126 by the bit line driver 108 in response to write data. Likewise, the bit cells of an accessed bit cell row are selectively accessed for read accesses based on the configuration of the bit lines 126 by the column logic module 110.

As described in greater detail herein, each of the bit cells of the memory array 102 includes a transfer gate operable by a corresponding pair of word lines, whereby the conductance state of the transfer gate can be configured based on the particular configurations of the corresponding pair of word lines. In one embodiment, the control logic 112 configures the pair of word lines of an accessed bit row independently so as to adjust the conductance of the transfer gates of the bit cells of the accessed bit row to a particular conductivity state based on the access type. To illustrate, to improve the stability of the accessed bit cell during a read access, the control logic 112 can configure the transfer gate of the accessed bit cell to have a first conductance that reduces the likelihood of inadvertently disturbing the accessed bit cell. In contrast, to improve the speed and robustness of a write access to the bit cell, the control logic 112 can configure the transfer gate to have a second conductance state that typically is higher than the conductance state for a read access.

In one embodiment, the memory device 100 can be configured to operate in at least two voltage modes: a normal power mode based on a normal operating voltage ($V_N$); and a low power mode based on a low operating voltage ($V_L$). The normal operating voltage $V_N$ can be, for example, 0.9 V, whereas the low operating voltage $V_L$ can be, for example, 0.4 V. The voltage modes may be controlled by changing the potential of the high voltage reference, such as a supply voltage, or by changing the potential of the low voltage reference (e.g. ground). Due to the electrical characteristics of the bit cells of the memory array 102, the read access of a bit cell at the normal operating voltage $V_N$ may exhibit different stability characteristics compared to the read access of the bit cell at the low operating voltage $V_L$. Accordingly, the control logic 112 further can configure the transfer gate of a bit cell to have a third conductance state during a low-power read access, where the third conductance state typically is lower than the conductance state of the transfer gate for normal read accesses. Further, when the bit cells of a bit cell row are not being accessed, the control logic 112 can configure their transfer gates into a substantially non-conductive state. The word line driver 104, the bit line 108, and the column logic module 110 are operable at both the normal operating voltage $V_N$ and the low operating voltage $V_L$ as stated for the memory 102. In another embodiment, the word line driver 104, the bit line 108, and the column logic module 110 each may be operated at only one voltage level, such as $V_N$.

Thus, by configuring the transfer gates of bit cells via individual control of the corresponding pair of word lines, the control logic 112 can adjust the conductance of the transfer gates according to the type of access being performed on the bit cells, thereby facilitating faster and more complete write accesses while facilitating improved bit cell stability during read accesses. The Beta ratio for the bit cells of the memory device 100 is equal to conductance of a pull down transistor in the bit storage device over (divided by) conductance of the transfer gates. To improve stability of the bit cells of the memory device 100 during the normal read access or the low-power read access the conductance of the pull down transistor needs to be higher than the conductance of the transfer gate, so that the Beta ratio is high. A high Beta ratio prevents corruption of the bit cell during a read access. Additionally, during a write access, it is desirable for the transfer gate conductance to be higher than the conductance of the pull down transistor making the Beta ratio low. A low Beta ratio eases the writing of the bit cells of the memory device 100. The Alpha ratio for the bit cells of the memory device 100 is equal to conductance of a pull up transistor in the bit storage device over (divided by) conductance of the transfer gates. To improve stability of the bit cells of the memory device 100 during the normal read access or the low-power read access the conductance of the pull up transistor needs to be higher than the conductance of the transfer gate, so that the Alpha ratio is high. A high Alpha ratio prevents corruption of the bit cell during a read access. Additionally, during a write access, it is desired that the transfer gate conductance be higher than the conductance of the pull up transistor making the Alpha ratio low. A low Alpha ratio eases the writing of the bit cells of the memory device 100.

Figure 2:
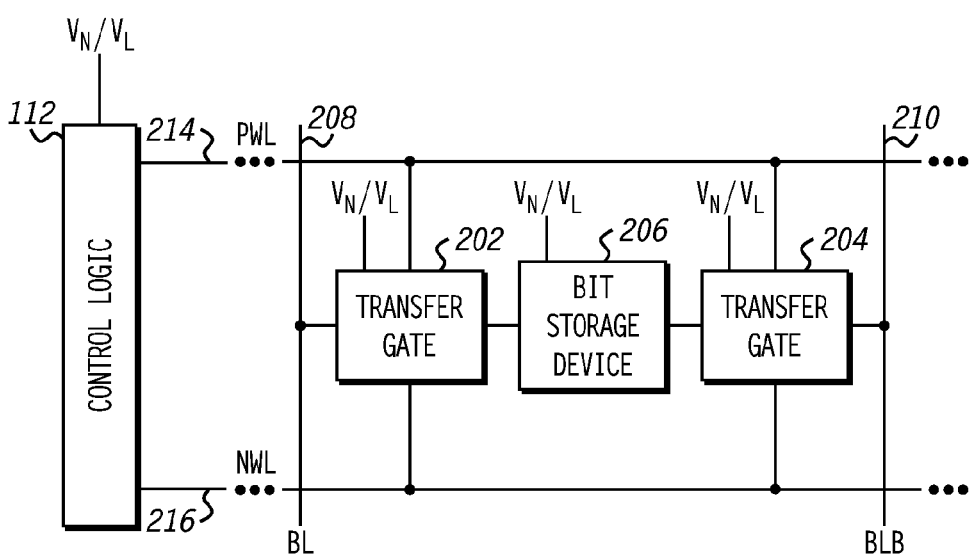
FIG. 2 illustrates a block diagram of a particular embodiment of a bit cell of the memory device of FIG. 1.

FIG. 2 illustrates a block diagram of the control logic 112 and a particular embodiment of a bit cell 200 of a memory array, such as memory array 102 of FIG. 1. The bit cell 200 includes a first transfer gate 202, a second transfer gate 204, a bit storage device 206, a bit line (BL) 208, a complementary bit line (BLB) 210, a first word line (PWL) 214 and a second word line (NWL) 216. The bit storage device 206 comprises a circuit component configured to store a voltage (or charge) representative of a bit value. Example implementations of the bit storage device 206 include cross-coupled inverters, a capacitor with refresh circuitry, and the like.

The transfer gates 202 and 204 initiate access between the bit storage device 206 and the bit lines 208 and 210, respectively. For read accesses, the transfer gate 202 communicates a logic value (in the form of a voltage) from the bit storage device 206 to the bit line 208 and the transfer gate 204 communicates the inverse logic value (in the form of a different voltage) to the complementary bit line 210. For write accesses, the voltage on the bit line 208 (representing a logic value) and the voltage on the complementary bit line 210 (representing the inverse logic value) are communicated to the bit cell storage device 206 via the transfer gate 202 and the transfer gate 204, respectively, so as to program the bit cell storage device 206. As described in greater detail herein with reference to FIG. 3, the transfer gates 202 and 204 can comprises a plurality of transistors coupled in parallel, whereby the first word line 214 and the second word line 216 are used by the control logic 112 to selectively enable or disable each transistor individually so as to achieve a certain conductance conducive to a particular type of access to be performed on the bit cell 200.

In one embodiment, the bit cell 200 is operable for read accesses at two or more operating modes, including the normal operating mode using the normal operating voltage $V_N$ and the low-power operating mode using the low operating voltage $V_L$. Further, the bit cell 200 is operable for write accesses at the normal operating mode. Accordingly, the control logic 112 can individually configure the first word line 214 and the second word line 216 such that the transfer gates 202 and 204 have a first conductance during a write access, a second conductance during a normal read access, and a third conductance during a low-power read access, thereby facilitating increased bit cell stability while also facilitating faster and more complete programming of the bit cell 200. The transfer gates 202 and 204 are also operable at two or more operating modes, including the normal operating mode using the normal operating voltage $V_N$ and the low-power operating mode using the low operating voltage $V_L$. The operating modes for the transfer gates 202 and 204 are changed according to the operating mode of the bit storage device 206.

Figure 3:
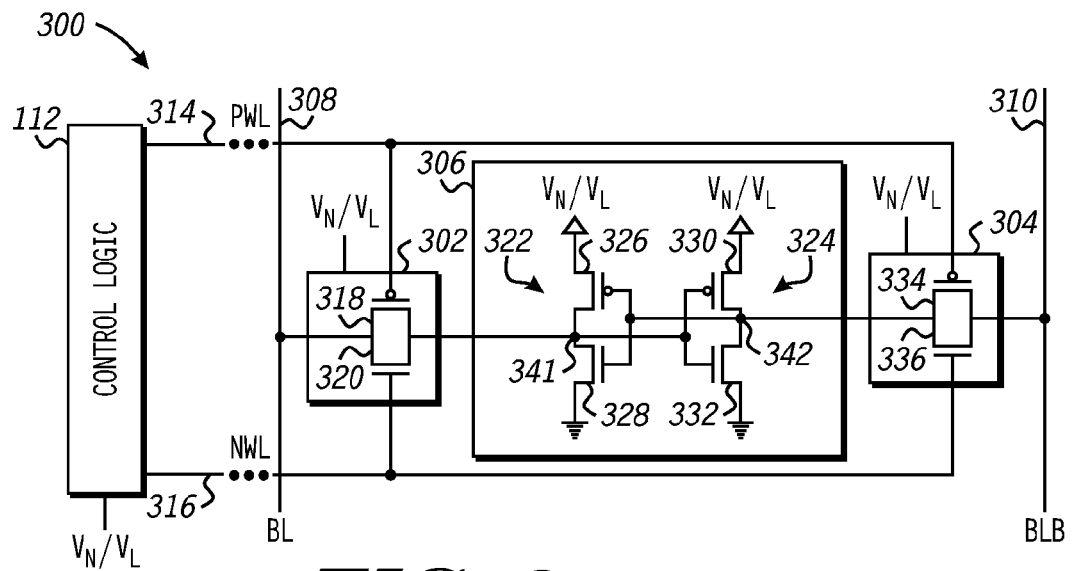
FIG. 3 illustrates a circuit diagram of a particular embodiment of the bit cell of FIG. 2.

FIG. 3 illustrates a particular circuit implementation of the bit cell 300. The bit cell 300 corresponds to, for example, the bit cell 200 of FIG. 2 and includes a first transfer gate 302, a second transfer gate 304, a bit storage device 306, a bit line (BL) 308, a complementary bit line (BLB) 310, a first word line (PWL) 314, and a second word line (NWL) 316.

In the illustrated example, the bit storage device 306 includes cross-coupled inverters 322 and 324, whereby the inverter 322 includes, for example, a p-type transistor 326 and an n-type transistor 328, and the inverter 324 includes, for example, a p-type transistor 330 and an n-type transistor 332. The transistor 326 includes a first current electrode connected to a first voltage reference $V_N$ for during a normal voltage operation and $V_L$ during a low voltage operation, a second current electrode, and a control electrode. The transistor 328 includes a first current electrode connected to the second current electrode of the transistor 326, a second current electrode connected to a second voltage reference (e.g. ground), and a control electrode coupled to the control electrode of the transistor 326. The transistor 330 includes a first current electrode connected to the first voltage reference, a second current electrode coupled to the control electrode of the transistor 326, and a control electrode coupled to the second current electrode of the transistor 326. The transistor 332 includes a first current electrode coupled to the second current electrode of the transistor 330, a second current electrode connected to the second voltage reference, and a control electrode coupled to the control electrode of the transistor 330.

The transfer gate 302, in one embodiment, includes a transistor 318 and a transistor 320 connected in parallel. Likewise, the transfer gate 304 can include a transistor 334 and a transistor 336 connected in parallel. As illustrated, the transistors 318 and 320 each include a current electrode connected to the bit line 308 and a current electrode connected to a node 341 of the bit cell storage device 306. The control electrode of the transistor 318 is connected to the first word line 314 and the control electrode of the transistor 320 is connected to the second word line 316. Similarly, the transistors 334 and 336 each includes a current electrode connected to the complementary bit line 310 and a current electrode connected to a node 342 of the bit storage device 306. The control electrode of the transistor 334 is connected to the first word line 314 and the control electrode of the transistor 336 is connected to the second word line 316.

The voltage at node 341 of the bit storage device 306 represents the logic value stored at the bit storage device 306 and, conversely, the voltage at node 342 represents the inverse logic value. As FIG. 3 illustrates, the transfer gate 302 connects the node 341 and the first bit line 308 and the transfer gate 304 connects the node 342 to the second bit line 310. Thus, the resistance of the transfer gate 302 and the resistance of the transistor 328 in effect form a voltage divider between the bit line 308 and the ground voltage reference. Likewise, the resistance of the transfer gate 304 and the resistance of the transistor 332 in effect form a voltage divider between the complementary bit line 310 and the ground voltage reference. Thus, it typically is advantageous to configure the transfer gates 302 and 304 to provide a relatively high resistance (low conductance) for read accesses so as to reduce or minimize disturbance of the cross-coupled inverters 322 and 324, and configure the transfer gates 302 and 304 to provide a relatively low resistance (high conductance) for write accesses so as to speed up the programming of the cross-coupled inverters 322 and 324.

In at least one embodiment, the control logic 112 (FIG. 2) individually configures the first word line 314 and the second word line 316 to individually enable or disable the transistors 318, 320, 334, and 336 so as to adjust the conductance of the transfer gates 302 and 304 according to the type of access being performed for the bit cell 300. To illustrate, for write accesses the control logic 112 can configure the first word line 314 and the second word line 316 so as to enable both the transistor 318 and the transistor 320 of the transfer gate 302 and likewise enable both transistor 334 and the transistor 336 of the transfer gate 304. As a result, the transfer gates 302 and 304 provide a relatively high conductance. For normal read accesses, the control logic can configure the first word lines 314 and the second word line 316 such that only one of the transistor 318 and the transistor 320 is enabled and only one of the transistor 334 and the transistor 336 is enabled. As a result of enabling only one transistor of each transfer gate, the transfer gates 302 and 304 provide a lower conductance compared to the instance described above whereby both parallel transistors are enabled. Further, when the bit cell 300 is not being accessed, the control logic 112 can configure the first word line 314 and the second word line 316 so as to disable all of the transistors 318, 320, 334, and 336, thereby configuring the transfer gates 302 and 304 to be substantially non-conductive.

Additionally, the conductances of the transistors 318, 320, 334, and 336 may be adjusted to allow different access to the bit cell 306 by changing the voltage potentials of the first word line 314 and the second word line 316 by the control logic 112. A higher voltage potential of the first word line 314 and the second word line 316 to the transistors 318, 320, 334, and 336 results in the n-type transistors having a greater conductance, and a lower voltage potential causes the n-type transistors to have a lower conductance. Conversely, a lower voltage potential results in the p-type transistors having a greater conductance, and a higher voltage potential causes the p-type transistors to have a lower conductance.

As described above, the bit cell 300 can be configured to operate in both a normal power mode and a low-power mode, whereby read accesses can be performed on the bit cell 300 during both modes. The lower voltage used during the low-power mode can increase the susceptibility of disturbance to the bit cell 300 during a read access compared to a read access during the normal operating mode. Accordingly, it may be advantageous to configure the transfer gates 302 and 304 to have a lower conductance than during normal read operations so as to improve bit cell stability. Thus, in one embodiment, the control logic 112 individually configures the first word line 314 and the second word line 316 to configure the transfer gates 302 and 304 to provide at least four different conductances, one conductance for normal read accesses, another conductance for low-power read accesses, a third conductance for write accesses, and a fourth conductance for non-accesses.

In one embodiment, the conductivity of the transistor 318 when enabled differs from the conductivity of the transistor 320 when enabled, thereby allowing the transfer gate 302 to be configurable to four different conductance states based on which of the transistors 318 and 320 are enabled. To illustrate, assume that the transistor 318 has a conductance $C_1$ and the transistor 320 has a conductance $C_2$ for a given voltage. Accordingly, when both transistors 318 and 320 are enabled, the total conductivity for the transfer gate 302 is $C_1+C_2$. When only the transistor 318 is enabled, the total conductivity for the transfer gate is $C_1$. Likewise, when only the transistor 320 is enabled, the total conductance for the transfer gate is $C_2$. Accordingly, assuming that the conductance $C_1$ is greater than the conductance $C_2$ and assuming that it is advantageous to have a high conductance for write accesses, a low conductance for normal read accesses, and a very low conductance for low-power read accesses, by individually controlling the first word line 314 and the second word line 316, the control logic 112 can enable transistor 318 and transistor 320 during write accesses, enable transistor 318 and disable transistor 320 during normal read accesses, and enable transistor 320 and disable transistor 318 during low-power read accesses so as to achieve the desired conductivities for each access type. The transfer gate 304 may be similarly configured.

The difference between the conductance of the transistor 318 and the conductance of the transistor 320 (and the difference between the conductance of the transistor 334 and the conductance of the transistor 336) can be achieved in any of a variety of manners. To illustrate, as n-type transistors typically have a greater conductance than p-type conductors for a given layout size, in one embodiment one of the transistors can be an n-type transistor and the other transistor can be a p-type transistor. Alternately, one transistor can have a greater channel width than the other transistor so as to achieve an appropriate difference in conductances. Also, as the process characteristics and channel characteristics are varied in the transistors, the transistors have different conductances. The larger the channel length in a transistor the lower conductance. As the process characteristics, such as dopant used and threshold implants, for making a transistor are varied the conductances also vary. As yet another example, one transistor can be implemented with a lower threshold voltage than the other transistor. So, having different process characteristics and channel characteristics for the transistor 318 and the transistor 320 (and the transistor 334 and the transistor 336) causes the transistors in the transfer gates to have different conductances. Although various examples for implementing transistors having different conductances in a transfer gate have been described, other techniques may be implemented without departing from the scope of the disclosure.

Figure 4:
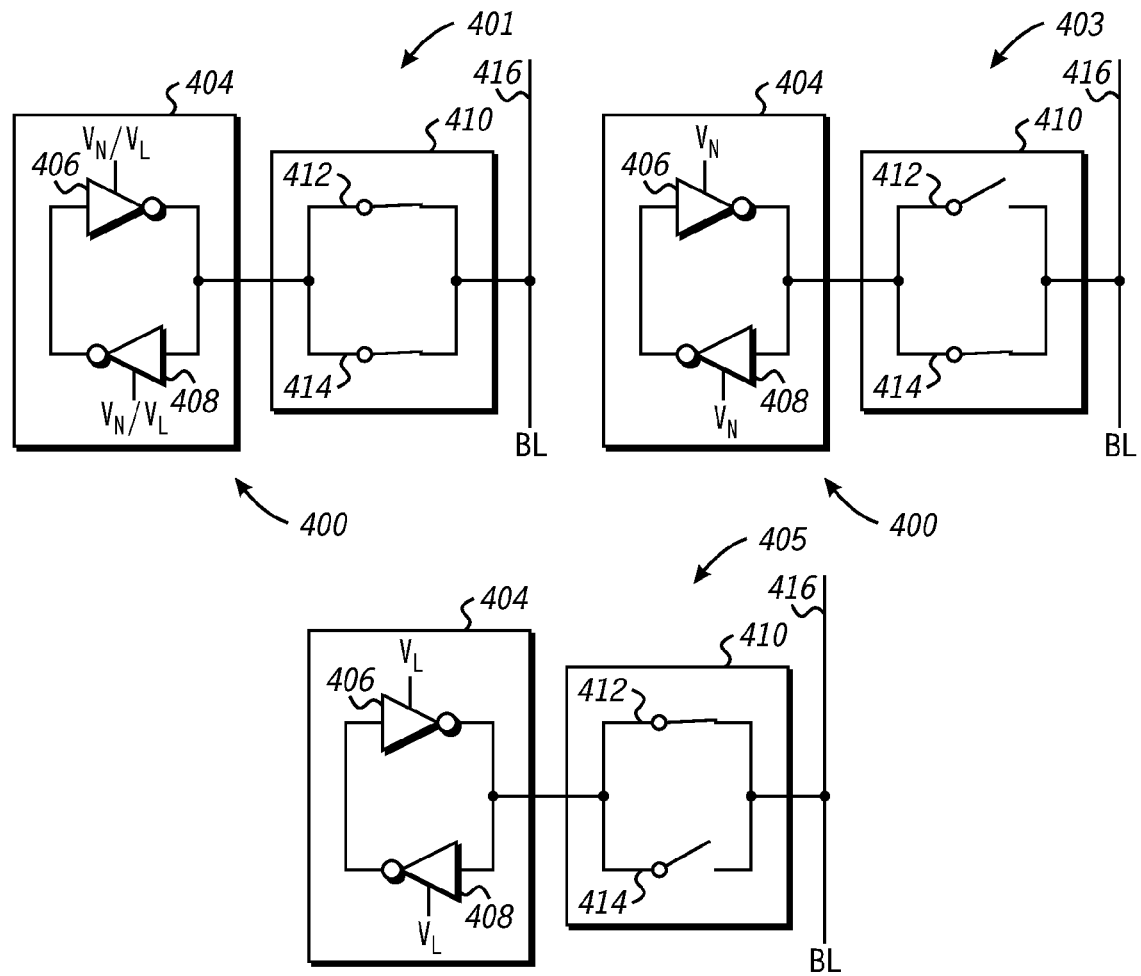
FIG. 4 illustrates an example sequence of transfer gate conductance states for different accesses to a bit cell.

FIG. 4 illustrates an example sequence of transfer gate states, or conductance levels, for accessing a bit cell 400. The bit cell 400 includes a bit storage device 404 connected to a bit line 416 via a transfer gate 410, whereby the transfer gate 410 includes a transistor 412 and a transistor 414 connected in parallel. For purposes of description, the transistors 412 and 414 are illustrated as switches so as to graphically convey their enabled/disabled states. Further, it is assumed for the purposes of FIG. 4 that the transistor 412 has a lower conductance compared to the transistor 414 when enabled.

In write configuration 401, the transistors 412 and 414 are enabled (and thus depicted as closed switches). As a result, the transfer gate 410 has a relatively high conductance, which increases the ability of the bit cell 402 to transfer the voltage from the bit line 416 to the bit storage device 404. In normal read configuration 403, the transistor 412 is disabled and the transistor 414 is enabled. As a result, the transfer gate 410 has a relatively low conductance, which increases the stability of the bit storage device 404 during the normal read access. In a low-power read configuration 405, the transistor 412 is enabled and the transistor 414 is disabled. As a result, the transfer gate 410 has an even lower conductance, which increase the stability of the bit storage device 404 during the low-power read access.

Different channel and process characteristics of a transistor create different conductances for the transistor. The channel characteristics include changing the channel width and length for a transistor. As the channel width increases the conductance increase, whereas when the channel length increases the conductance decreases. The process characteristics that effect the conductance of a transistor include the dopant used, and any threshold implants added to the transistor.

Figures 5, 6:
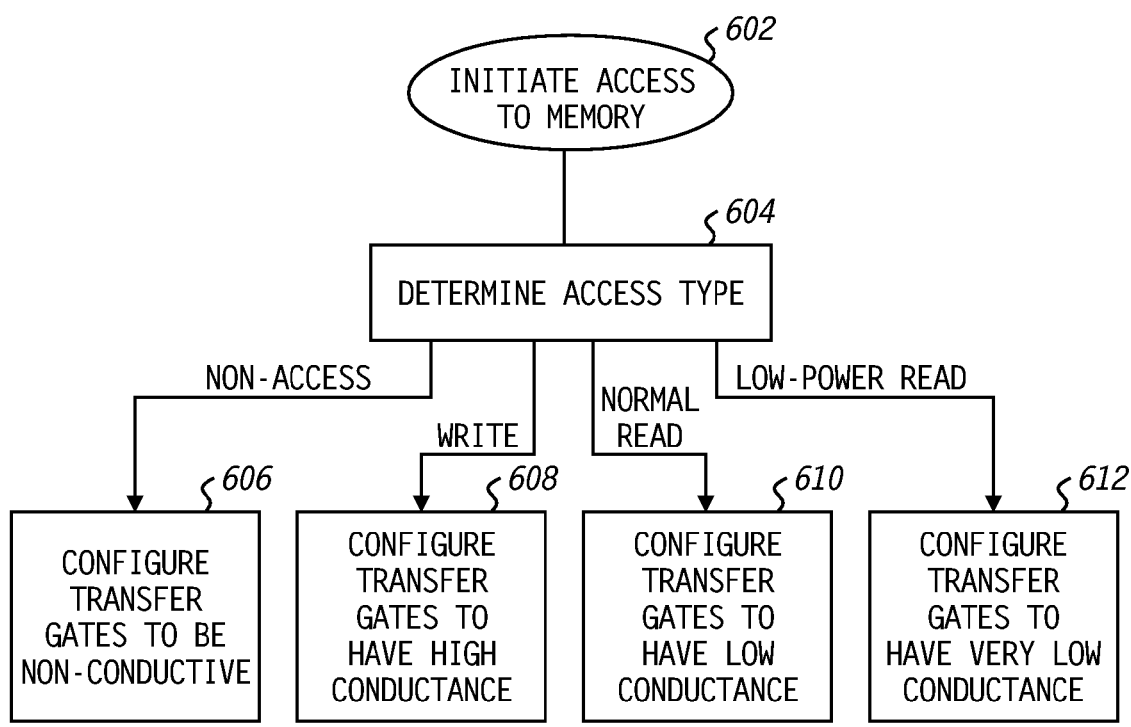
FIG. 5 illustrates a table of transfer gate control signal states and corresponding transfer gate conductance levels for a particular embodiment of a bit cell.
FIG. 6 illustrates a flow chart of an example method for accessing a bit cell utilizing a transfer gate conductance that is based on access type.

FIG. 5 illustrates an example logic table 500 implemented by control logic 112 for selectively enabling and disabling parallel transistors of a transfer gate of a bit cell so as to adjust its conductance based on access type. For ease of illustration, the logic table 500 is described in the context of the transfer gate 302 of the bit cell 300 of FIG. 3, whereby the transistor 318 comprises a p-type transistor and the transistor 320 comprises an n-type transistor, with the transistor 320 having a higher conductance than the transistor 318. Each row of the logic table 500 corresponds to an access type. The first and second columns of the logic table 500 illustrate the logic states for the PWL and NWL lines for each access type and the third column illustrates the corresponding conductance level of the transfer gate 302. As illustrated by logic table 500, for a normal read access the control logic configures the PWL line and the NWL line to a logic high state, thereby producing a low transfer gate conductance. During a write access the control logic configures the PWL line to a logic low state and configures the NWL line to a logic high state, thereby producing a high transfer gate conductance. In response to determining that no access is to occur to the bit cell for a given memory access cycle, the control logic configures the PWL line to a logic high state and configures the NWL line to a logic low state, thereby causing the transfer gate 302 to become essentially non-conductive. For a low-power read access, control logic configures both the PWL line and the NWL line to a logic low state, thereby producing a very low transfer gate conductance. Thus, as illustrated by the logic table 500, the PWL line and the NWL line are independently controlled to produce different transfer gate conductances in response to different access types.

FIG. 6 illustrates a flow chart 600 of a method for accessing a bit cell having an adjustable transfer gate conductance based on the type of access. At block 602, the word lines initiate access to a row of bitcells in a memory array. The access type (non-access, write access, normal read access, and low-power read access) is determined at block 604. For non-access of the bit cell the transfer gates are configured to be non-conductive at block 606. At block 608, to have a write access of the bit cell, the transfer gates are configured to have a high conductance. High conductance of the transfer gates eases the transfer of the logic from the bit line to the bit cell. While the bit cell is at a normal operating voltage configuring the transfer gates to have a low conductance performs a read access at block 610. The low conductance allows the logic from the bit cell to pass to the bit line, but at the same time if the bit line is already charged the logic on the bit line does not pass to the bit cell. At block 612, for a low power-operating mode read access the transfer gates are configured to have a very low conductance.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A memory device comprising:
   a bit cell comprising:
      a bit storage device;
      a first word line;
      a second word line; and
      a transfer gate to connect the bit storage device to a bit line, the transfer gate configurable to at least four conductance states based on a state of the first word line and a state of the second word line; and
   control logic to configure, for an access to the bit cell, the state of the first word line and the state of the second word line based on an access type of the access.

2. The memory device of claim 1 further comprising:
   a memory array comprising a plurality of bit cells, the plurality of bit cells comprising the bit cell.

3. The memory device of claim 1 wherein:
   the transfer gate is configured to a first conductance in response to the state of the first word line comprising a first logic level and the state of the second word line comprising a second logic level;

the transfer gate is configured to a second conductance in response to the state of the first word line comprising the second logic level and the state of the second word line comprising the second logic level;

the transfer gate is configured to a third conductance in response to the state of the first word line comprising the first logic level and the state of the second word line comprising the first logic level; and the transfer gate is configured to a fourth conductance in response to the state of the first word line comprising the second logic level and the state of the second word line comprising the first logic level;

wherein the first conductance is less than the second conductance, the second conductance is less than the third conductance, and the third conductance is less than the fourth conductance.

4. The memory device of claim 3 wherein the control logic is to:

configure the first word line to the first logic level and configure the second word line to the first logic level in response to the access comprising a read access for a first operating mode associated with a first voltage;

configure the first word line to the second logic level and configure the second word line to the second logic level in response to the access comprising a read access for a second operating mode associated with a second voltage lower than the first voltage; and configure the first word line to the second logic level and configure the second word line to the first logic state in response to the access comprising a write access.

5. The memory device of claim 1 wherein the at least four conductances comprises:

a first conductance associated with a non-access;

a second conductance associated with a read access at a first voltage;

a third conductance associated with a read access at a second voltage, the second voltage greater than the first voltage; and a fourth conductance associated with a write access.

6. The memory device of claim 5 wherein the first conductance is lower than the second conductance, the second conductance is lower than the third conductance, and the third conductance is lower than the fourth conductance.

7. The memory device of claim 1 wherein the transfer gate comprises:

a first transistor comprising a first current electrode coupled to the bit line, a second current electrode coupled to an output of the bit storage device, and a control electrode coupled to the first word line; and a second transistor comprising a first current electrode coupled to the bit line, a second current electrode coupled to the output of the bit storage device, and a control electrode coupled to the second word line.

8. The memory device of claim 7 wherein the first transistor comprises a p-type transistor and the second transistor comprises an n-type transistor.

9. The memory device of claim 7 wherein the first transistor comprises a first process characteristic and the second transistor comprises a second process characteristic different than the first process characteristic.

10. The memory device of claim 7 wherein the first transistor comprises a first channel characteristic and the second transistor comprises a second channel characteristic different than the first channel characteristic.

11. A method comprising:

providing a memory device comprising a bit cell comprising a bit storage device coupled to a bit line via a transfer gate;

initiating an access to the bit cell;

configuring the transfer gate to have a first conductance in response to the access comprising a read access at a first voltage level;

configuring the transfer gate to have a second conductance in response to the access comprising a read access at a second voltage level, the second conductance different than the first conductance and the second voltage level different than the first voltage level; and accessing the bit storage device via the transfer gate.

12. The method of claim 11 further comprising:

configuring the transfer gate to have a third conductance in response to the access comprising a write access, the third conductance different than the first conductance or the second conductance.

13. The method of claim 11 wherein accessing the bit storage device comprises programming a bit value for the bit storage device from the bit line.

14. The method of claim 11 wherein accessing the bit storage device comprises reading a bit value from the bit storage device to the bit line.

15. The method of claim 11 wherein:

the second voltage level is less than the first voltage level; and the first conductance is greater than the second conductance.

16. The method of claim 11 wherein:

the transfer gate comprises a first transistor and a second transistor coupled in parallel, wherein the first transistor has a lower conductance than the second transistor when activated; and configuring the transfer gate to have the first conductance comprises:

activating only the second transistor.

17. The method of claim 16 wherein configuring the transfer gate to have the second conductance comprises:

activating only the first transistor.

18. The method of claim 16 wherein configuring the transfer gate to have the third conductance comprises:

activating both the first transistor and the second transistor.

19. The method of claim 16 wherein the first transistor comprises a p-type transistor and the second transistor comprises an n-type transistor.

20. The method of claim 16 wherein the first transistor comprises a first channel width and the second transistor comprises a second channel width greater than the first channel width.

* * * * *